United States Patent [19]

Emanuel

[11] 4,348,892

[45] Sep. 14, 1982

[54] APPARATUS AND METHOD FOR TESTING THE PERFORMANCE OF ELECTRICAL MACHINES

[76] Inventor: Ervin M. Emanuel, P.O. Box 2175, Prairie View, Tex. 77445

[21] Appl. No.: 86,532

[22] Filed: Oct. 19, 1979

[51] Int. Cl.³ ............................................ G01R 35/00
[52] U.S. Cl. ..................................... 73/116; 322/99
[58] Field of Search ....................... 73/116; 290/40 B; 250/231 SE; 324/83 R, 158 MG, 83 D; 318/490, 638, 650, 683, 713, 799, 806; 322/20, 99

[56] References Cited

U.S. PATENT DOCUMENTS

| | | | |
|---|---|---|---|
| 1,935,292 | 11/1933 | Griscom et al. | 290/40 B |
| 3,525,026 | 8/1970 | Ahamed | 318/490 X |
| 4,091,662 | 5/1978 | Emanuel | 73/116 |

OTHER PUBLICATIONS

Jansch, H. G. et al., "A fast response . . . synchronous machines", from Journal of Physics E (G.B.), vol. 4, No. 1, Jan. '71, pp. 43–45.

*Primary Examiner*—Jerry W. Myracle
*Attorney, Agent, or Firm*—Kenneth Baugh

[57] ABSTRACT

This invention relates to an apparatus for determining the power angle in electrical AC machines. The invention includes means for determining the synchronous rotating magnetic field of the AC machine and means for determining the angular velocity of the machine's rotor. The value of the angular velocity of the machine's rotor is subtracted from the value of the synchronous rotating magnetic field. The difference between the synchronous rotating magnetic field of the machine and the value of the angular velocity of the machine's rotor is multipled by a predetermined constant to produce an accurate measure of the power angle of the machine being tested.

16 Claims, 2 Drawing Figures

APPARATUS AND METHOD FOR TESTING THE PERFORMANCE OF ELECTRICAL MACHINES

BACKGROUND OF THE INVENTION

1. Field of the Invention

This invention relates to a testing apparatus and more particular to an apparatus which is used for determining the power angle of an AC electrical machine during operation.

2. Description of the Prior Art

The need for monitoring equipment that will accurately provide real time measurements of the characteristics of AC machines is occurring more and more frequently. Because of insufficient monitoring equipment adequate data of machine characteristics during normal and emergency conditions are not provided, thus in some instances contributing to the total collapse of some power systems.

Although some monitoring equipment exists such as for example: The systems disclosed in U.S. Pat. No. 3,052,117 and U.S. Pat. No. 4,091,662 systems such as these do not provide a readily accessible measurement of an essential machine characteristic. This characteristic is known as the power angle. The power angle is the angle between an electric machines' excitation voltage and the system's infinite bus voltage. Mechanically the power angle can be expressed as the instantaneous difference between the angular velocity of the machine's rotor and the machine synchronous rotating magnetic field. In Bulk Power generating systems it is very desirable to monitor the power angle of the electric machines in order to assure the stability of the machines and reduce the risk of power failure.

Standard AC machines which generally operate at a frequency of 60 hertz a ± 0.05 hertz should maintain a power angle of less than 90% in order to maintain its stability. If the machine does not maintain its stability this could contribute to a power failure.

In some power systems relays are employed which eliminate the particular machine from the system if the value of the power angle is unacceptable. However, this approach at best makes you aware of the problem when it is already in existence and in some instances this may be too late to prevent power failure.

It is desirable therefore, to provide a means which is capable of continuously monitoring the AC machines in a power system in order that it may be determined at all times whether an undesirable condition is imminent.

SUMMARY OF THE INVENTION

The invention relates to an apparatus and method for testing AC machines. More particularly this apparatus provides an accurate method and means for testing an AC generator or other AC machine for the power angle. When an AC generator is being tested a first signal having a frequency component proportional to the actual angular velocity of the rotor of the AC generator is produced by an AC Tachometer generator. A reference signal is provided by an AC voltage source that has a frequency component which is representative of the synchronous rotating magnetic field of the AC Generator. The first signal and the reference signal are coupled to a frequency transducer in order to derive from the frequency component of the first signal a constant DC output which is proportional to the angular velocity of the AC generator's rotor and from the frequency component of the reference signal a constant DC output which is proportional to the synchronous rotating magnetic field of the AC generator. These DC signals are then subtracted. The difference in these DC signals are then multiplied by a predetermined constant to produce a measurement of the power angle of the AC generator.

DETAILED DESCRIPTION

Figure 1:
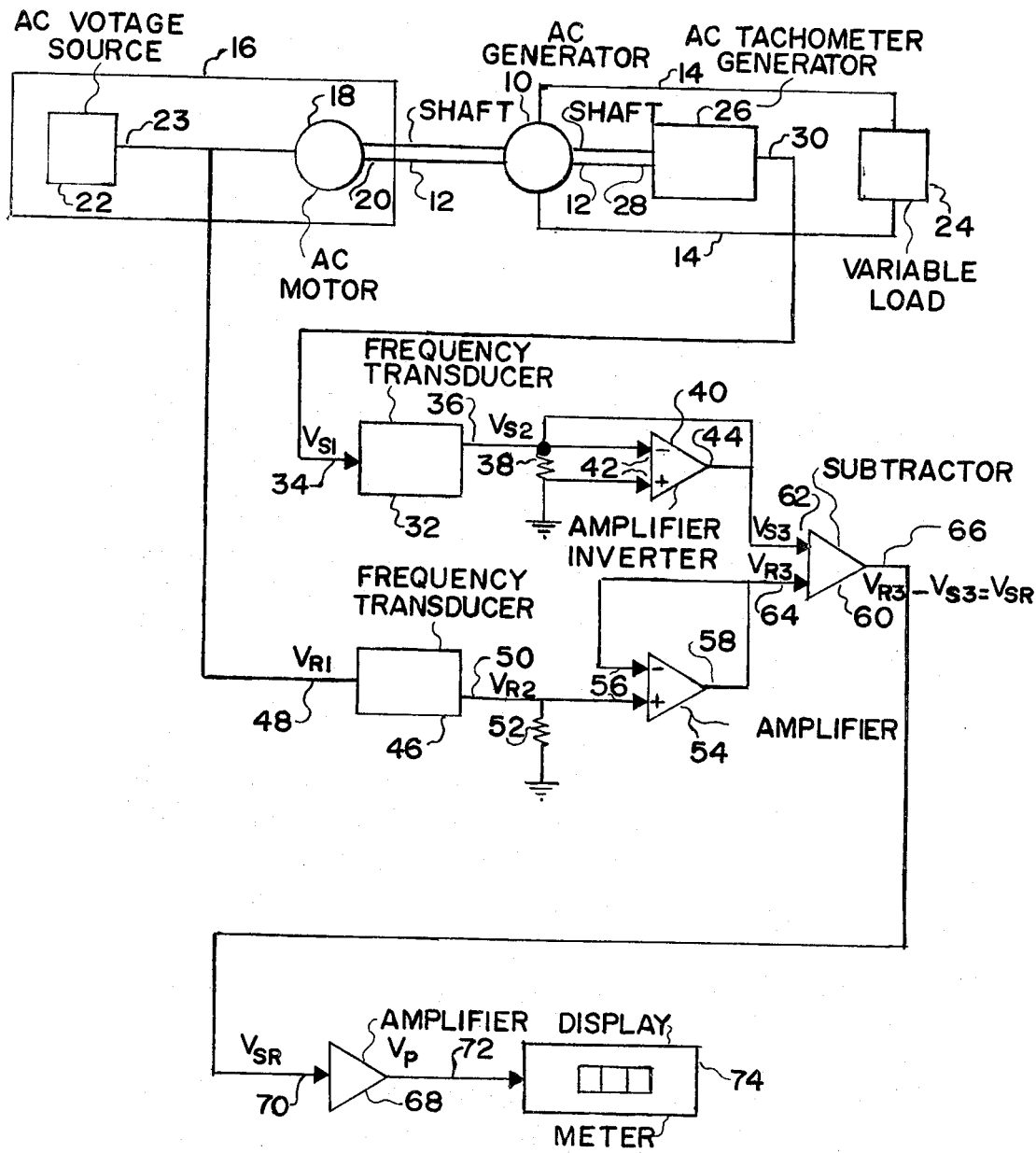
FIG. 1 is a circuit schematic of an apparatus for determining the power angle of the AC electric generator.

Referring now to FIG. 1 there is shown an AC generator 10 to be tested having a shaft 12 and an electric output 14. The shaft 12 of the AC generator 10 is mechanically coupled to an activating source 16. The activating source 16 includes an AC motor 18 having a shaft 20 connected to the shaft 12 of the AC generator 10 and an AC voltage source 22 having an output 23 which is electrically coupled to the AC motor 18. The output 14 of the AC generator 10 is connected to a variable load 24. The variable load 24 may be a rheostat capable of varying the resistance across the output 14 of the AC generator 10. An AC Tachometer Generator 26 having a shaft 28 and an electrical output 30 is mechanically coupled at the shaft to the shaft 12 of the AC generator 10. The AC Tachonometer 26 senses the angular velocity of the rotor of the AC generator 10 and in response thereto provides a signal at the output 30 whose frequency is proportional to the angular velocity of the rotor of the AC generator. An Tachonometer generator suitable for use in this circuit is a 60 hertz 1800 r.p.m. 4 pole 125 volt AC synchronous generator with a permanent magnet rotor.

A precise frequency transducer 32 having an input 34 and output 36 is coupled at the input 34 to the output 30 of the AC Tachonometer generator 26. A load resistor 38 is coupled from the output 36 of the frequency transducer 32 to ground. The frequency transducer 32 accepts frequency as its input and provides a constant DC current output into a variable impedance load with a 0.02% load resistance effect. By using a 10K OHM resistor as the resistor 38 a 0–5 volt DC signal is available at the output 36 of the frequency transducer 32 with a 0.02% linearity and 0–5 accuracy when 55–60 hertz is present at the input 34 of the frequency transducer. An example of a suitable precision frequency transducer for use in this invention is the series FCX-1 frequency transducer manufactured by Rochester Instrument Systems, Inc.

An operational amplifier 40 having an input 42 is coupled at the negative node of the input 42 to the output 36 of the frequency transducer 32 and at the positive node of the input to ground. The operational amplifier 40 is connected with negative feedback to enhance stability. Since output 36 of the frequency transducer 32 is coupled to the negative node of the input 42 of the operational amplifier 40 the polarity of the signal at an output 44 of the amplifier will have a negative polarity when the signal at the output 36 of the frequency transducer is positive. The operational amplifier 40 is used as an inverter.

A second frequency transducer 46 having an input 48 and an output 50 is coupled at the input to the output 23 of the AC voltage source 22. The AC voltage source 22 provides a reference signal whose frequency component is representative of the AC generator synchronous rotating magnetic field. Output 50 of the frequency transducer 46 provides a constant DC current output in response to the frequency component of the reference signal produced by the AC voltage source 22. An operational amplifier 54 having an input 56 and output 58 is coupled to the output 50 of the frequency transducer at the positive node of the input 56. The input 56 of the operational amplifier 54 has its negative node electrically coupled to the output 58 of the operational amplifier to provide feedback and thereby enhance the stability of the amplifier. With the output 50 of the frequency transducer 46 connected to the negative node of the input 56 of the operational amplifier 54 the signal at the output 58 of the operational amplifier will follow the polarity of the signal at the output 50 of the frequency transducer 46.

A subtractor 60 having input nodes 62 and 64 and an output 66 is coupled at the node 62 to the output 44 of the operational amplifier 40 and at the node 64 to the output 58 of the operational amplifier 54. The output signal produced at the output 66 of the subtractor 60 is equivalent to the difference between the angular velocity of the AC generator's rotor and the synchronous rotating magnetic field of the generator. The subtractor 60 in the preferred embodiment is a third operational amplifier which performs subtractions by adding the two opposite polarity signals coupled to its input. It will be understood that the operational amplifiers 40 and 54 could be connected in such a fashion as to produce output signals of the same polarity and that other means could be used to subtract the two signals without departing from the scope of this invention. The output 66 of the subtractor 60 is coupled to an amplifier 68. The amplifier 68 acts as a multiplier in order that the signal from the output 66 may be converted to a signal representative of degrees. Specifically, the amplifier 68 takes a signal which is representative of degrees by multiplying the signal at its input by a predetermined constant. The predetermined constant is established by setting the gain of the operational amplifier 68 at such a magnitude that cycles per second can be converted to degrees using the known relation between the two. It should be understood that this conversion could also be done using a series of operational amplifiers or other like components without departing from the scope of this invention. An output 72 of the amplifier 68 is coupled to a digital display meter 74. The digital display meter 74 displays the value of the power angle in degrees.

When the AC Generator 10 is being tested, a signal $V_{S1}$ whose frequency component is proportional to the actual angular velocity of the rotor of the AC generator is produced by the AC Tachometer generator 26 and coupled to the input 34 of the frequency Transducer 32. Similarily a reference signal $V_{R1}$ whose frequency component is proportional to the synchronous rotating magnetic field of the generator is coupled from the A.C. voltage source 22 to the input 48 of the frequency transducer 46. In response to the signal $V_{S1}$ and $V_{R1}$ constant DC current signals $V_{S2}$ and $V_{R2}$ respectively are produced at the outputs 36 and 50 of the transducer 32 and 46 respectively. The DC signal $V_{S2}$ is then coupled to the input 42 of the operational amplifier 40 and the DC signal $V_{R2}$ is coupled to the input 56 of the operational amplifier 54.

The operational amplifier 40 which acts as an inverter produces a DC signal $V_{S3}$ at its output 44 which has a polarity opposite to the signal $V_{S2}$. The operational amplifier 54 produces a signal $V_{R3}$ at its output 58 which is of the same polarity of the signal $V_{R2}$. The signals $V_{S3}$ and $V_{R3}$ are fed to inputs 62 and 64 respectively of the subtractor 60. The subtractor 60 takes the difference of the signals $V_{S3}$ and $V_{R3}$ by adding the two input signals and thereby produces an output signal $V_{SR}$. The signal $V_{SR}$ represents the difference between the synchronous rotating magnetic field of the AC generator 10 and the actual angular velocity of the rotor of the AC generator. The signal $V_{SR}$ is then fed to the operational amplifier 68 where it is multiplied by a predetermined constant to produce a signal VP which when fed to the display meter 74 produces a measurement of the power angle of the AC generator 10 in degrees.

It should be understood, that the test conditions of the AC generator 10 can be varied by simply varying the variable load 24, thereby allowing the generator to be tested under a variety of load circumstances, such as might be the case when the generator is connected in a power system.

Figure 2:
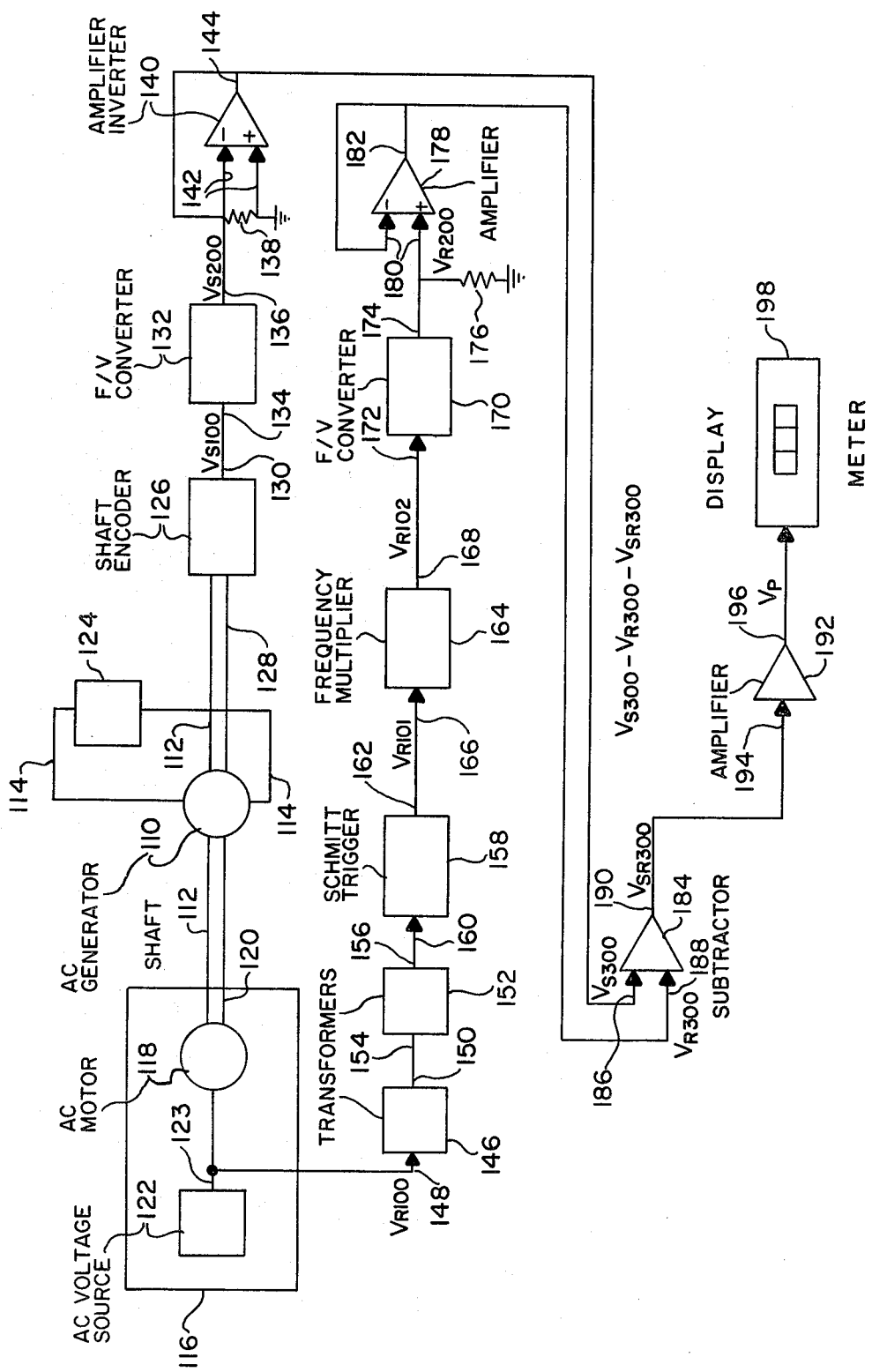
FIG. 2 is a circuit schematic illustrating a second embodiment of the invention.

Refering to FIG. 2 an AC generator 110 to be tested having a shaft 112 and an electrical output 114 is coupled at the shaft to an energizing source 116. The energizing source 116 includes an AC motor 118 having a shaft 120 connected to the shaft 112 of the AC generator 110, and an AC voltage source 122 having an output 123 which is electrically coupled to the AC motor 118. A variable load 124 which can be a rheostat capable of varying the resistance on the generator 110 is coupled to the output 114 of the AC generator. A shaft encoder 126 having a shaft 128 and an output 130 is mechanically coupled at its shaft to the shaft 112 of the AC generator 110. The shaft encoder 126 provides output pulses proportional to the number of revolutions of the rotor of the AC generator 110. The output signals of the shaft encoder 126 may be sinusodial or a squarewave depending on the type of encoder used. The number of pulses available per revolution can range from 1 to 500 or more depending on the size of the generator being tested. An example of a suitable shaft encoder which can be used is the combination of an emitter wheel having light and opaque areas about its periphery and a light emitting diode and photodiode placed on opposite sides of the emitter wheel for producing a pulse when one of the light areas is positioned between them.

A frequency to voltage converter 132 having an input 134 and an output 136 is coupled at its input to the output 130 of the shaft encoder 126. The frequency to voltage converter 132 is used to convert the pulsating signal of the shaft encoder 126 to a proportional DC level. An example of a suitable precision frequency to voltage converter circuit which can be used to perform the desired function is shown in National Linear Semiconductor Data Book published in July of 1978. The output 136 of the frequency to voltage converter 132 is coupled to ground through a load resistor 138. The load resistor 138 has the same characteristics as the load resistors 38 and 52 in FIG. 1.

An operational amplifier 140 having an input 142 and output 144 is coupled at the negative node of the input 142 to the output 136 of the frequency to voltage converter 132. The positive node of the input 142 of the amplifier 140 is connected to ground. The amplifier 140 utilizes negative feedback to enhance its stability. The operational amplifier 140 inverts the signal at the output 136 of the frequency to voltage converter 132.

A current transformer 146 having an input 148 and output 150 is coupled at the input 148 to the output 123 of the AC voltage source 122. The output 150 of the current transformer 146 is coupled to a potential transformer 152 at an input 154. The current transformer 146 and potential transformer 152 scale down the current and voltage levels of the sinosodial signal produced by the AC voltage souce 122. The AC voltage source 122 generates a reference signal which is representative of the synchronous rotating magnetic field of the AC generator 110.

The potential transformer 152 is coupled at an output 156 to a Schmitt trigger 158 at its input 160. The Schmitt trigger is a well known bistable circuit which can be set to change states on the slope of a sinosodial input signal to produce a binary output signal. A frequency multiplier 164 having an input 166 and output 168 is coupled to an output 162 of Schmitt trigger. The frequency multiplier 164 multiplies the signal at the output of the Schmitt trigger by a factor, such as for example one hundred, to produce a signal at its output which is equal to the same number of pulses per cycle as the signal produced at the shaft encoder when the power angle is zero degrees. That is, the frequency multiplier 164 produces a signal at its output 168 which is comparable to the signal at the output 130 of the shaft encoder 126 by increasing the number of pulses per cycle of the signal at the output of the Schmitt trigger.

A frequency to voltage converter 170 having an input 172 and output 174 is coupled to the output 168 of the frequency multiplier 164 at its input. This frequency to voltage converter 170 is of the same type as the frequency to voltage converter 132. A load resistor 176 identical to the load resistor 138, is coupled from the output 174 of the frequency to voltage converter 170 to ground. An operational amplifier 178 having an input 180 and output 182 is coupled at the positive node of the input to the output 174 of the frequency to voltage converter 170. The operational amplifier 178 has the negative node of its input 180 coupled to the output 182 to provide negative feedback and thereby enchance stability. The signal at the output 182 of the operational amplifier 178 will follow the polarity of the signal at the output 174 of the frequency to voltage converter 170.

The output 144 of the operational amplifier 140 and the output 182 of the operational amplifier 178 are coupled to a subtractor 184, at inputs 186 and 188 respectively. An output 190 of the subtractor 184 is then coupled to an operational amplifier 192 at its input 194. The operational amplifier 192 acts as a multiplier in this embodiment just as does the operational amplifier 68 in FIG. 1. An output 196 of the multiplier 192 is coupled to a display meter 198 which displays the power angle of the generator 110 in degrees.

When under test, the AC generator 110 is activated by the activating source 120. When activated a digital signal $V_{S100}$ which represents the angular velocity of the generator's rotor is produced by the shaft encoder 126 and coupled to the frequency to voltage converter 132. A sinosodial reference signal $V_{R100}$ representative of the synchronous rotating magnetic field of the generator 110 is coupled from the source 122 to the current transformer 146. The reference signal $V_{R100}$ is then scaled down by the current and voltage transformers 146 and 152 and then coverted to a digital signal $V_{R101}$ by the Schmitt trigger 158. The signal $V_{R101}$ is then multiplied by the frequency multiplier 164 to produce a signal $V_{R102}$ which is comparable to the signal $V_{S100}$.

The signal $V_{R102}$ is then coupled to the frequency to voltage converter 170. The frequency to voltage converter 132 and 170 converts the signals $V_{S100}$ and $V_{R102}$ respectively to proportional DC signals $V_{S200}$ and $V_{R200}$ respectively. The signals $V_{S200}$ and $V_{R200}$ are then fed to the amplifiers 140 and 178 respectively where signals $V_{S300}$ and $V_{R300}$ which are of opposite polarity are produced at the inputs 186 and 188 respectively of the subtractor 184. In response to the signals $V_{S300}$ and $V_{R300}$ the subtractor 184 produces at output 190 a signal $V_{SR300}$ which is equivalent to the difference between the generator's synchronous rotating field and the angular velocity of the generator's rotor. This signal $V_{SR300}$ is then fed to the multiplier 192 to provide a signal VP at its output which when fed to the digital display panel 198 will allow the panel to provide a representation in degrees of the power angle of the generator.

It should be understood, that the foregoing invention provides testing apparatus for determining the power angle of an electric generator very rapidly and completely. However, it should be understood that the apparatus shown could also be used to monitor the performance of other electrical machines as well. Still further, it should be understood that the apparatus can be used to monitor generators or other AC machines while operating in a normal operating environment without departing from the scope of the invention.

While this invention has been described using particular embodiment it will be apparent that improvements and other modifications may be made without departing from the scope of the invention as defined in the appending claims.

What is claimed is:

1. An apparatus for determining the power angle of an AC generator comprising:
    means mechanically coupled to the generator for activating the generator;
    means electrically coupled to the generator for varying the load on the generator;
    means mechanically coupled to the generator for sensing the actual rotor speed of the generator and for producing a first signal which is proportional to the rotor speed;
    means coupled to the activating means for producing a second signal which is proportional to the synchronous rotating magnetic field of the generator;
    means for producing a third signal which is equal to the difference between the first signal and the second signal; and
    means for multiplying the third signal by a predetermined constant to produce a signal representing degrees and thereby produce a signal representing the power angle of the generator.

2. The apparatus of claim 1 wherein said activating means includes an electric motor mechanically coupled to the generator and a source of alternating current voltage electrically coupled to the motor.

3. The apparatus of claim 2 wherein the means for sensing the rotor speed and for producing the first signal includes an alternating current tachometer generator mechanically coupled to the generator for sensing the actual rotor speed of the generator and for producing a signal having a frequency proportional to the rotor speed.

4. The apparatus of claim 3 wherein the means for sensing the rotor speed and for producing the first signal further includes a frequency transducer electrically coupled to the alternating current tachometer generator for producing a direct current voltage proportional to the output frequency of the alternating current tachometer generator.

5. The apparatus of claim 4 wherein the means for producing the second signal includes a frequency transducer for producing a direct current voltage proportional to the frequency of the source of alternating current voltage.

6. The apparatus of claim 5 further including means for displaying the signal representing the power angle of the generator.

7. The apparatus of claim 6 wherein the means for displaying is a digital meter.

8. An apparatus for determining the power angle of an AC generator comprising:
   means mechanically coupled to the generator for activating the generator;
   a source of alternating current voltage for supplying power to the generator activating means;
   means electrically coupled to the generator for varying the load on the generator;
   means mechanically coupled to the generator for sensing the actual rotor speed of the generator and for producing a first signal which is proportional to the rotor speed;
   means electrically coupled to the alternating current source voltage for converting the alternating current source signal to a pulsating signal having a frequency greater than the alternating current source signal and producing a second signal in response to said pulsating signal whose frequency is proportional to the synchronous rotating magnetic field of the generator;
   means for producing a third signal which is equal to the difference between the first signal and the second signal; and
   means for multiplying the third signal by a predetermined constant to produce a signal representing the power angle of the generator.

9. The apparatus of claim 8 wherein the means for sensing the rotor speed and for producing the first signal includes a shaft encoder mechanically coupled to the generator for sensing the actual rotor speed of the generator and for producing a pulsating signal in response thereto leaving a frequency proportional to the rotor speed.

10. The apparatus of claim 9 wherein the means for sensing the rotor speed and for producing the first signal further includes a frequency to voltage converter coupled to the shaft encoder, for producing a direct current voltage proportional to the frequency of the shaft encoder.

11. The apparatus of claim 10 wherein the means for converting the alternating current source to a pulsating signal and for producing the second signal includes:
   first means coupled to the alternating current voltage source for reducing the voltage and current level of the alternating current voltage source signal;
   second means coupled to the first means for producing a pulsating signal in response to the signal generated by the first means;
   third means coupled to the second means for multiplying the pulsating signal by a predetermined constant to produce a signal having a greater number of pulses per cycle than the pulsating signal; and
   fourth means coupled to said third means for producing a direct current voltage signal proportional to the frequency of the signal produced by the third means.

12. The apparatus of claim 11 wherein the second means includes a Schmitt trigger for producing a pulsating signal in response to the signal generated by the first means.

13. The apparatus of claim 12 wherein the third means includes a frequency multiplier for multiplying the pulsating signal by a predetermined constant to produce a signal having a greater number of pulses per cycle than the pulsating signal.

14. The apparatus of claim 13 wherein the fourth means includes a frequency to voltage converter for producing a direct current voltage signal proportional to the synchronous rotating magnetic field of the generator.

15. The apparatus of claim 14 further including means for displaying the signal representing the power angle.

16. A method for determining the power angle of an A.C. generator including the steps of:
   activating a generator;
   varying a load on the generator;
   determining the rotor speed of the generator and producing a first signal proportional to the rotor speed;
   determining the synchronous rotating magnetic field of the generator and producing a second signal proportional to the synchronous rotating magnetic field;
   producing a third signal which is equal to the difference between the first signal and second signal; and
   multiplying the third signal by a predetermined constant to produce a signal representing the power angle of the generator.

* * * * *